United States Patent
Yoshimoto et al.

(10) Patent No.: US 7,031,792 B2
(45) Date of Patent: Apr. 18, 2006

(54) PROCESSING APPARATUS AND INFORMATION STORAGE APPARATUS AND METHOD

(75) Inventors: Yuji Yoshimoto, Kumamoto (JP); Ryouichi Uemura, Kumamoto (JP); Kunie Ogata, Kumamoto (JP); Yoichi Deguchi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 504 days.

(21) Appl. No.: 10/114,248

(22) Filed: Apr. 3, 2002

(65) Prior Publication Data

US 2002/0145922 A1    Oct. 10, 2002

(30) Foreign Application Priority Data

Apr. 4, 2001  (JP) ............................. 2001-105855
May 18, 2001 (JP) ............................. 2001-148717
May 18, 2001 (JP) ............................. 2001-148718

(51) Int. Cl.
*G06F 19/00*   (2006.01)
*H01L 21/30*   (2006.01)

(52) U.S. Cl. ..................... 700/121; 700/95; 700/117; 438/5

(58) Field of Classification Search ................. 700/90, 700/95, 117, 120, 121, 112; 91/1; 340/500; 438/5

See application file for complete search history.

(56) References Cited

U.S. PATENT DOCUMENTS

| | | | | |
|---|---|---|---|---|
| 3,895,560 A | * | 7/1975 | Anderson ...................... 91/1 |
| 4,426,683 A | * | 1/1984 | Kissell ...................... 700/275 |
| 4,556,030 A | * | 12/1985 | Aono ...................... 123/406.42 |
| 4,782,809 A | * | 11/1988 | Kotowski et al. ............ 123/531 |
| 5,038,737 A | * | 8/1991 | Nishiyama et al. ..... 123/406.42 |
| 5,555,195 A | | 9/1996 | Jensen et al. |
| 5,591,299 A | | 1/1997 | Seaton et al. |
| 6,230,095 B1 | * | 5/2001 | Wang ......................... 701/110 |
| 6,233,492 B1 | | 5/2001 | Nakamura et al. |
| 6,360,132 B1 | | 3/2002 | Lin et al. |
| 6,363,294 B1 | | 3/2002 | Coronel et al. |
| 6,424,880 B1 | | 7/2002 | Goder et al. |
| 6,431,465 B1 | * | 8/2002 | Yie ............................... 239/88 |
| 6,445,443 B1 | | 9/2002 | Park et al. |
| 6,510,688 B1 | * | 1/2003 | Adler et al. ................... 60/399 |
| 6,557,134 B1 | | 4/2003 | Bims et al. |
| 6,741,925 B1 | * | 5/2004 | Masters et al. ............ 701/115 |
| 6,775,611 B1 | * | 8/2004 | Kobayashi et al. ......... 701/114 |
| 2002/0013654 A1 | * | 1/2002 | Masters et al. ............ 701/110 |
| 2003/0121495 A1 | * | 7/2003 | Abo ............................ 123/295 |
| 2003/0130784 A1 | * | 7/2003 | Peltier ........................ 701/104 |

FOREIGN PATENT DOCUMENTS

| | | |
|---|---|---|
| JP | 06-334018 | 12/1994 |
| JP | 11-074170 | 3/1999 |
| JP | 2000-252179 | 9/2000 |

* cited by examiner

*Primary Examiner*—Jayprakash N. Gandhi
(74) *Attorney, Agent, or Firm*—Oblon, Spivak, McClelland, Maier & Neustadt, P.C.

(57) ABSTRACT

A processing apparatus comprises a process apparatus body equipped with a plurality of process sections for applying a predetermined processing to a target object and a transfer device for transferring the target object among the process sections, a first control section for controlling the entire process apparatus body including the transfer device, a second control section for controlling the plural process sections, an information storage section receiving the signal exchanged between the first control section and the second control section and storing a plurality of information including the information corresponding to the received signal, and an information storage selecting mechanism for selecting the storing frequency of the information to the information storage section in accordance with the kind of the information.

4 Claims, 13 Drawing Sheets

PROCESSING APPARATUS AND INFORMATION STORAGE APPARATUS AND METHOD

BACKGROUND OF THE INVENTION

1. Field of the Invention

The present invention relates to a processing apparatus for executing a prescribed process to an object target and particularly to a processing apparatus including two kinds of control units and information storage apparatus and method used thereof.

2. Description of the Related Art

For manufacturing a semiconductor device, various processes are executed such as a deposition process for depositing a prescribed film on an object target such as a semiconductor wafer, a photolithography process for patterning the prescribed film, an etching process for etching the prescribed film in accordance with the pattern. Accordingly, a deposition apparatus, a photoresist coating and development apparatus, an etching apparatus and other apparatuses are employed for executing the above-mentioned processes.

Here, the photoresist coating and development apparatus for the photolithography process is explained as an example. First, the semiconductor wafer is cleaned, applied to a hydrophobic process in an adhesion unit, cooled in a cooling unit, and coated by a photoresist film thereon in a photoresist coating unit. Then, the semiconductor wafer is pre-baked in a hot plate unit, cooled in the cooling unit, and light-exposed by a prescribed pattern thereon in a light-exposure unit. Further, the semiconductor wafer is applied to a post exposure baking process in the hot plate unit, cooled in the cooling unit, coated by a developing solution for developing the light-exposed pattern. Finally, the semiconductor wafer is post-baked in the hot plate unit in order to thermally transform and polymerize the film and improve an adhesion of the pattern to the semiconductor wafer. Thus, the photoresist coating and development apparatus is an integrated combination of a plurality of process units directed to a series of processes except the light exposure. Further, the photoresist coating and development apparatus includes a transfer apparatus for transferring in and from every process unit.

The above-explained photoresist coating and development apparatus is controlled by a first control unit for controlling recipes for the processes and the transfer apparatus and for communicate with a host computer and by a second control unit for controlling each process in each process unit, on the basis of the first control unit.

The above-mentioned first control unit outputs, toward the second control unit, data necessary for each process unit, while the second control unit controls each process unit, on the basis of the data from the first control unit and information from several sensors. Further, the control data is transmitted from the first control unit to the host computer.

Although complete control information is managed during and after executing the controls of each process unit, it is desired further that a more precise process control is required, that malfunctions and troubles in the apparatus are met quickly, and that a process history is captured in detail. Therefore, it is necessary to obtain not only the control data after completing the process unit control, but only measurement data such as temperature during actual processing, alarm data, or data of driving units.

However, it is intricate and impracticable to capture the process history by using conventional processing apparatuses, because the process elements and hardwares for the process elements are vast.

On the other hand, in the photoresist coating and development apparatus, the cylinder mechanisms are often used for, for example, vertical driving mechanisms of the pins for transferring of the semiconductor wafers in the hot plate unit and elevation mechanisms of the nozzles in the photoresist coating unit.

However, in the control described above, the operation actually performed by the cylinder mechanism is not grasped, though the information required for controlling the cylinder mechanism is prepared, and the information after the control is supervised. Therefore, even if the same control is performed by using a large number of modules using cylinder mechanism in the same processing in, for example, a multi-module system, the processing is rendered nonuniform where there is a variation in operations among the cylinder mechanisms. The prior art is incapable of coping with the particular case.

BRIEF SUMMARY OF THE INVENTION

An object of the present invention is to provide, in order to grasp process histories, a processing apparatus which may include various kinds of process units, an information storage apparatus and method for storing process histories, and a processing system wherein a plurality of the processing apparatuses are connected with and an information storage apparatus and a host computer.

Another object of the present invention is to provide an information storage apparatus and an information storing method, which permit storing the information on the cylinder mechanism in a state that the stored information can be effectively utilized.

Further, still another object of the present invention is to provide a supervising system of the cylinder mechanism, which permits grasping the information on the operation of the cylinder mechanism so as to supervise the cylinder mechanism.

According to a first aspect of the present invention, there is provided a processing apparatus, comprising a process apparatus body for applying a predetermined processing to a target object; a control mechanism for controlling said process apparatus body; an information storage section for receiving a signal from said control mechanism and storing a plural kinds of information including the information corresponding to the received signal; and an information storage selecting mechanism for selecting the storing frequency of the information to said information storage section in accordance with the kind of said information.

According to a second aspect of the present invention, there is provided a processing apparatus, comprising a process apparatus body for applying a predetermined processing to a target object; a control mechanism including a first control section and a second control section for controlling said process apparatus body; an information storage section for receiving a signal exchanged between said first control section and said second control section and storing a plural kinds of information including the information corresponding to the received signal; and an information storage selecting mechanism for selecting the storing frequency of the information to said information storage section in accordance with the kind of said information.

According to a third aspect of the present invention, there is provided an information storage apparatus for storing information in a processing apparatus comprising a process apparatus body for applying a predetermined processing to a target object and a control mechanism for controlling said process apparatus body, comprising an information storage section for receiving a signal from said control mechanism and storing a plural kinds of information including the information corresponding to the received signal; and an information storage selecting mechanism for selecting the storing frequency of the information to said information storage section in accordance with the kind of the information.

According to a fourth aspect of the present invention, there is provided an information storage apparatus for storing information in a processing apparatus comprising a process apparatus body for applying a predetermined processing to a target object, and a control mechanism including a first control section and a second control section for controlling said process apparatus body, comprising an information storage section for receiving the signal exchanged between the first control section and the second control section and storing a plural kinds of information including the information corresponding to the received signal; and an information storage selecting mechanism for selecting the storing frequency of information to said information storage section in accordance with the kind of said information.

According to a fifth aspect of the present invention, there is provided an information storage method for storing information in a information storage section in a processing apparatus comprising a process apparatus body for applying a predetermined processing to a target object and a control mechanism for controlling said process apparatus body, comprising at least the steps of receiving a signal from the control mechanism and storing in the information storage section a plural kinds of information including the information corresponding to the received signal; and selecting the storing frequency of information to the information section in accordance with the kind of information in said storing step.

According to a sixth aspect of the present invention, there is provided an information storage method for storing information in a information storage section in a processing apparatus comprising a process apparatus body for applying a predetermined processing to a target object and a control mechanism including a first control section and a second control section for controlling the process apparatus body, comprising the steps of receiving a signal exchanged between the first control section and the second control section and storing in the information storage section a plural kinds of information including the information corresponding to the received signal; and selecting the storing frequency of the information to the information storage section in accordance with the kind of information in said storing step.

According to a seventh aspect of the present invention, there is provided a processing apparatus, comprising a process apparatus body equipped with a process unit for applying a predetermined processing to a target object within a process chamber; a control mechanism for controlling said process apparatus body; an information storage section for receiving a signal from said control mechanism and storing a plural kinds of information including the information corresponding to the received signal; and a selecting mechanism for selecting the timing of starting the information storage to said information storage section in accordance with the kind of the information.

According to an eighth aspect of the present invention, there is provided a processing apparatus, comprising a process apparatus body equipped with a process unit for applying a predetermined processing to a target object within a process chamber; a control mechanism including a first control section and a second control section for controlling said process apparatus body; an information storage section for receiving a signal exchanged between said first control section and said second control section and storing a plural kinds of information including the information corresponding to the received signal; and a selecting mechanism for selecting the timing of starting said information storage to said information storage section in accordance with the kind of said information.

According to a ninth aspect of the present invention, there is provided an information storage apparatus for storing information in a processing apparatus comprising a process apparatus body equipped with a process unit for applying a predetermined processing to a target object within a process chamber and a control mechanism for controlling said process apparatus body, comprising an information storage section for receiving a signal from said control mechanism and storing a plural of kinds of information including the information corresponding to the received signal; and a selecting mechanism for selecting the timing of starting the information storage to said information storage section in accordance with the kind of said information.

According to a tenth aspect of the present invention, there is provided an information storage apparatus for storing information in a processing apparatus comprising a process apparatus body equipped with a process unit for applying a predetermined processing to a target object within a process chamber and a control mechanism for controlling said process apparatus body, said control mechanism including a first control section and a second control section, comprising an information storage section for receiving a signal exchanged between said first control section and said second control section and storing a plural kinds of information including the information corresponding to the received signal; and a selecting mechanism for selecting the timing of starting the information storage to said information storage section in accordance with the kind of said information.

According to an eleventh aspect of the present invention, there is provided an information storage method for storing information in a information storage section in a processing apparatus comprising a process apparatus body equipped with a process unit for applying a predetermined processing to a target object within a process chamber and a control mechanism for controlling said process apparatus body, comprising the steps of receiving a signal from said control mechanism and storing in the information storage section a plural kinds of information including the information corresponding to the received signal; and selecting the timing of starting the information storage to the information storage section in accordance with the kind of the information in said storing step.

According to a twelfth aspect of the present invention, there is provided an information storage method for storing information in a information storage section in a processing apparatus comprising a process apparatus body equipped with a process unit for applying a predetermined processing to a target object within a process chamber and a control mechanism including a first control section and a second control section for controlling said process apparatus body, comprising the steps of receiving a signal exchanged between the first control section and the second control section and storing in the information storage section a plural kinds of information including the information corresponding to the received signal; and selecting the timing of starting the information storage to the information storage section in accordance with the kind of the information in said storing step.

According to a thirteenth aspect of the present invention, there is provided an information storage apparatus of a cylinder mechanism for storing information on said cylinder mechanism, comprising detecting means for detecting a signal corresponding to a predetermined operation of said cylinder mechanism; and an information storage section for storing the information detected by said detecting means as a time information.

According to a fourteenth aspect of the present invention, there is provided an information storage method of a cylinder mechanism, comprising the steps of operating said cylinder mechanism; and storing the information on the operation of said cylinder mechanism as a time information.

Further, according to a fifteenth aspect of the present invention, there is provided a supervising system of a cylinder mechanism for supervising said cylinder mechanism, comprising detecting means for detecting a signal corresponding to a predetermined operation in said cylinder mechanism; and an information storage section for storing the information detected by said detecting means as a time information, wherein said cylinder mechanism is supervised by the detected information stored in said information storage section.

According to the present invention, it becomes easy to grasp the history of processes without employing any special measuring instrument, because the signal from the control mechanism which includes information necessary for grasping the process history such as detection information for processing such as temperature, particularly the signal transmitted and received between the first controller and the second controller, is taken out and stored in the information storage apparatus.

However, the information thus obtained is rendered prominently voluminous.

Therefore, according to the first to sixth aspects of the present invention, the amount of the stored information is decreased as much as possible by selecting the storing frequency of the information in accordance with the kind of the information. The amount of information to be stored can be markedly decreased by storing, for example, the information small in change once in a plurality of target substrates and the information large in change in every target substrate.

Also, according to the seventh to twelfth aspects of the present invention, the amount of information to be stored is markedly decreased by selecting the timing of starting the information storage in accordance with the kind of information. For example, concerning the information that is required to be obtained from before the target object is transferred into the process chamber of the process unit, the information storage in the information storage section is started from before the target object is transferred into the process chamber, concerning the information that need not be obtained before the target object is transferred into the process chamber, the information storage in the information storage section is started after the target object is transferred into the process chamber and, in the case where it suffices to obtain the information after the start of the treatment applied to the target object, the information storage in the information storage section is started after the treatment is started, thereby preventing storage of the excess information so as to markedly decrease the amount of the stored information.

Concretely, the first controller controls the processing apparatus including the transfer apparatus as a whole, while the second controller controls a plurality of the process units. In this case, the process history is easily grasped, because the second controller outputs information detected in the process units toward the first controller.

Further, according to the present invention, it becomes easy to grasp more precisely the history of processes, by employing additional sensors for detecting information which are not transmitted and received between the first controller and the second controller. In this case, the information included in the signal detected by the sensors are stored in the information storage apparatus.

Further, according to the thirteenth to fifteenth aspects of the present invention, a signal corresponding to a predetermined operation in the cylinder mechanism, e.g., an opening-closing signal of a valve for opening-closing a medium line for moving a piston forward or rearward or a signal generated from a sensor for detecting the forward movement or rearward movement of the piston, is detected and the detected information is stored in the information storage section as a time information so as to make it possible to grasp the operation history of the cylinder mechanism on a time series basis and, thus, to store the information on the operation of the cylinder mechanism in the state of being utilized effectively. For example, where there is a variation in the operations among the cylinder mechanisms of the modules in the multi-module system, it is possible to grasp easily the deviation in the operation of each cylinder mechanism from the information stored in the information storage section so as to make it possible to supervise effectively the adjustment or the like of the cylinder mechanism.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

Figure 1:
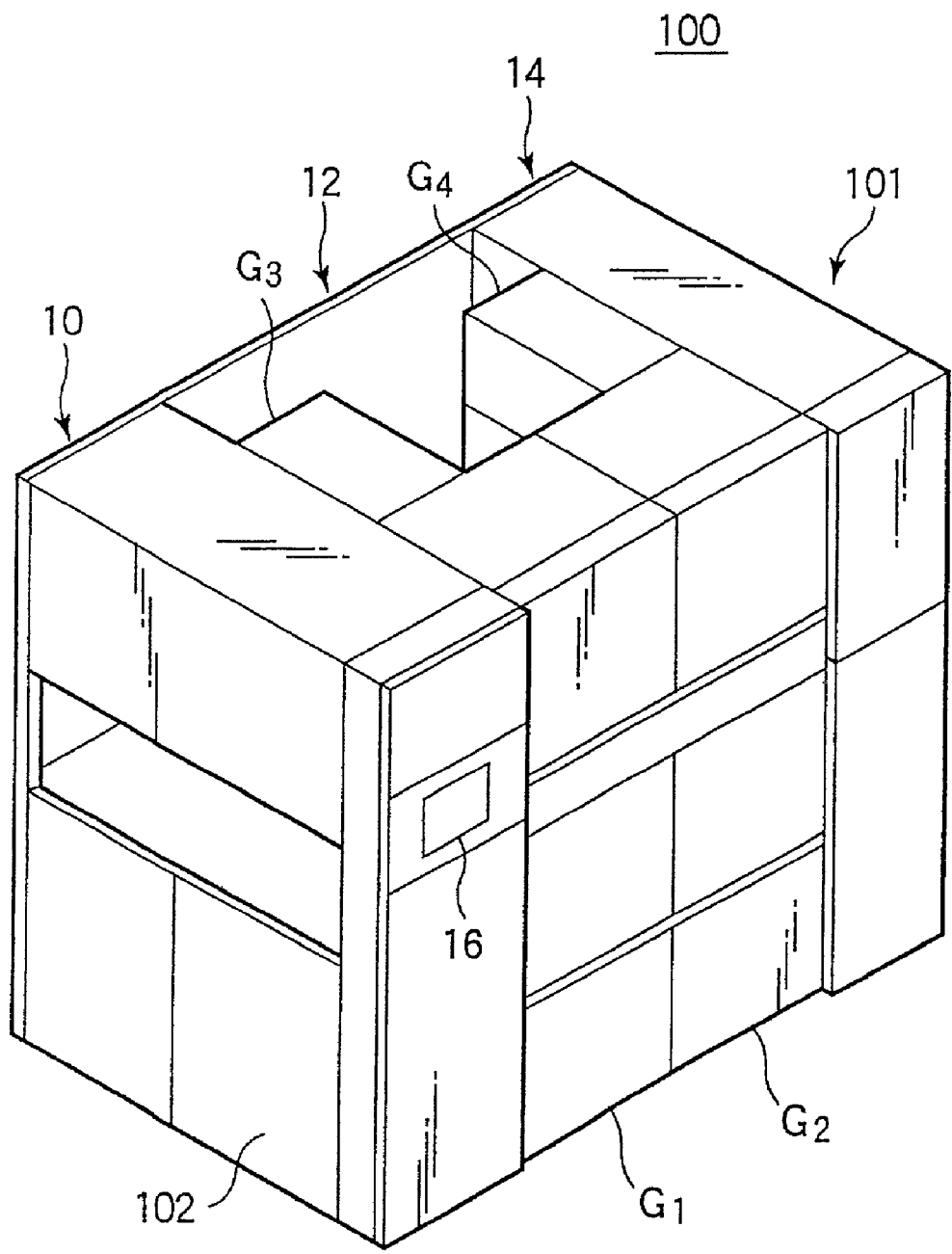
FIG. 1 is a oblique view of a photoresist coating and development apparatus according to a first embodiment of the present invention.

As shown in FIG. 1, the photoresist coating and development apparatus 100 of the present invention comprises an apparatus body 101 and control and data storage section 102 for controlling the apparatus body 101 and for storing control information and other information. The apparatus body 101 comprises a cassette station 10 for transferring, into and out of the apparatus 100 or a wafer cassette CR, the target objects to be processed such as semiconductor wafers or some other wafers W. For example, every 25 wafers W housed in the wafer cassette CR may be transferred into and out of the apparatus 100. The apparatus body 101 further comprises a processing station 12 where there is arranged at prescribed positioned a plurality of one by one type process units for applying a prescribed process in the coating and development process to wafers on the one by one basis. Further, the apparatus body 101 comprises an interface section 14 for transferring wafers into and out of a not-shown light-exposure apparatus or stepper. Further, the control and data storage section 102 is placed below the cassette station 10.

Figure 2:
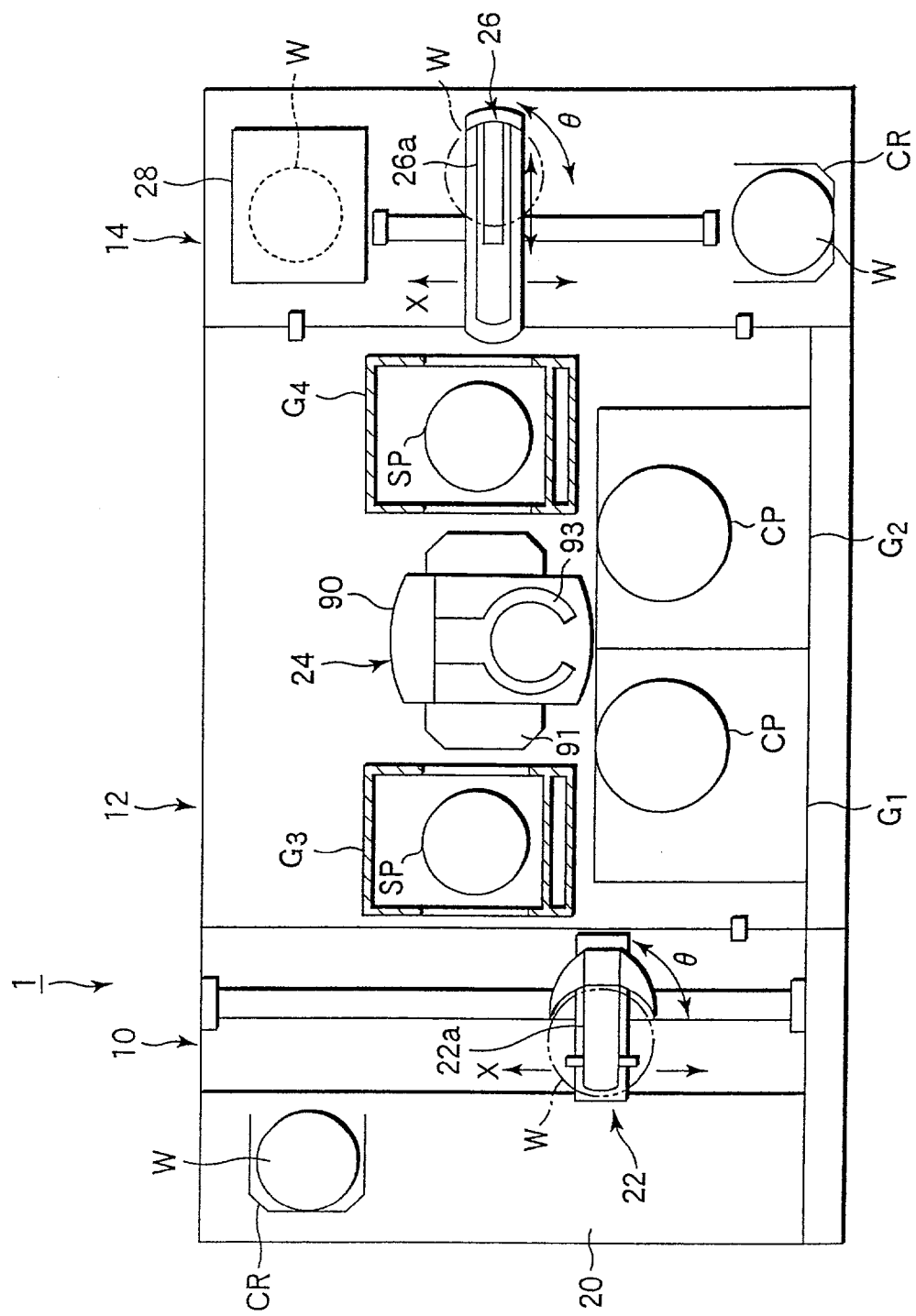
FIG. 2 is a plan view of the photoresist coating and development apparatus shown in FIG. 1.

The cassette station 10 as shown in FIG. 1 comprises a display 16, a cassette holder 20 and a wafer transfer mechanism 22 which has a wafer transfer arm 22a which is movable in X, Y and Z directions and rotatable in θ direction as shown in FIG. 2. A plurality of the wafer cassette CR, for example, 4 wafer cassettes CR can be put on the cassette holder 20.

As shown in FIG. 2, the processing station 12 comprises a first process unit group $G_1$ of liquid process units for applying a prescribed process to the wafer on a spin chuck in a cup CP, a second process unit group $G_2$, a third process unit group $G_3$ of thermal process units for applying a prescribed processing to the wafer on a holder SP, a fourth process unit group $G_4$, and main wafer transfer mechanism 24 movable in the vertical direction.

Figure 4:
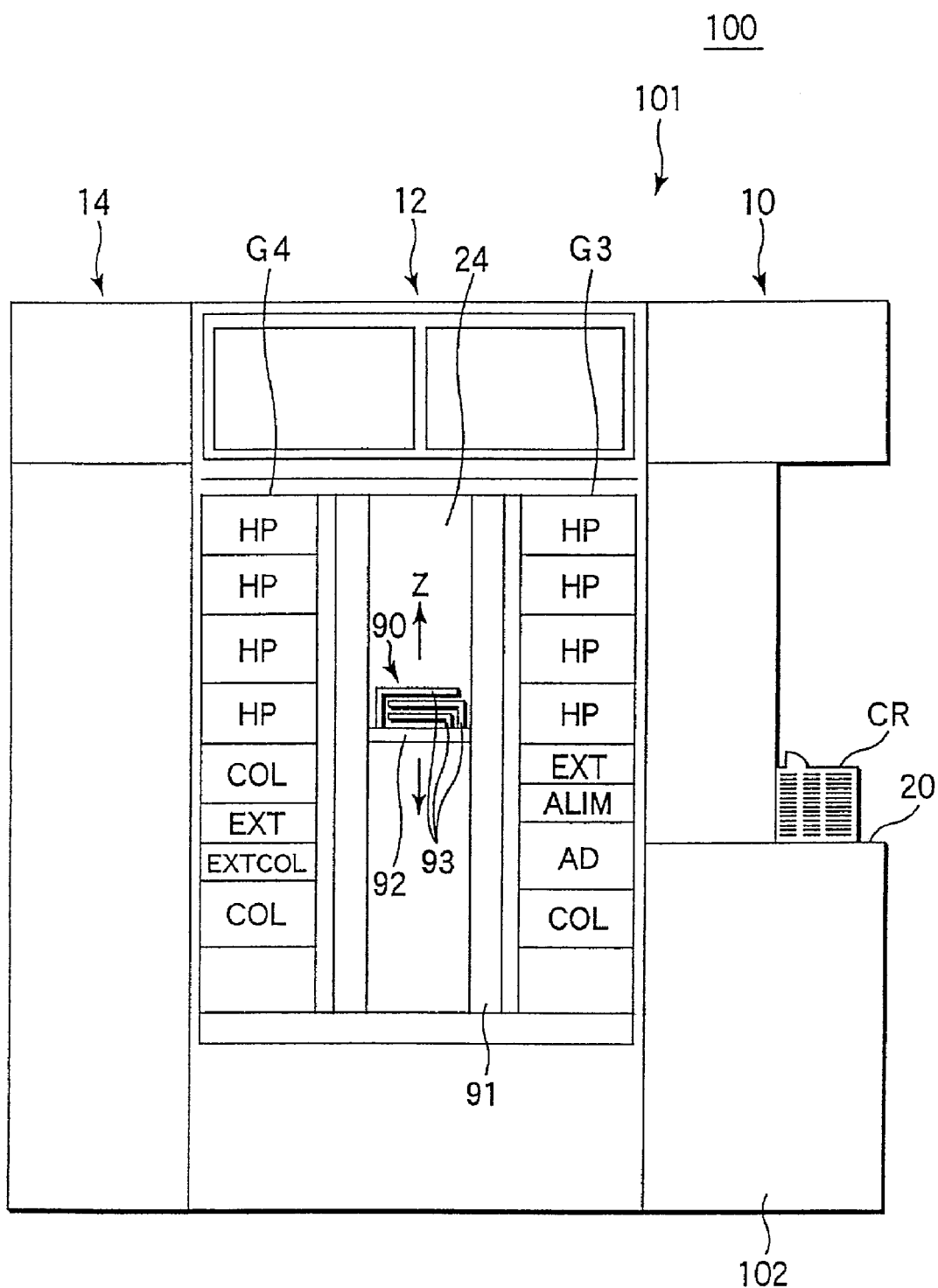
FIG. 4 is a rear view of the photoresist coating and development apparatus shown in FIG. 1.

As shown in FIG. 4, the main wafer transfer mechanism 24 can move in a vertical direction or Z direction a wafer transfer apparatus 90 inside a cylindrical support 91. The cylindrical support 91 is rotated by a not-shown Motor. The wafer transfer apparatus 90 is also rotated in accordance with the rotation of the cylindrical support 91.

The wafer transfer apparatus 90 has a plurality of holding members or pincettes 93 movable in the front and rear directions of a transfer base 92, thereby delivering the wafer W between the process units.

Figure 3:
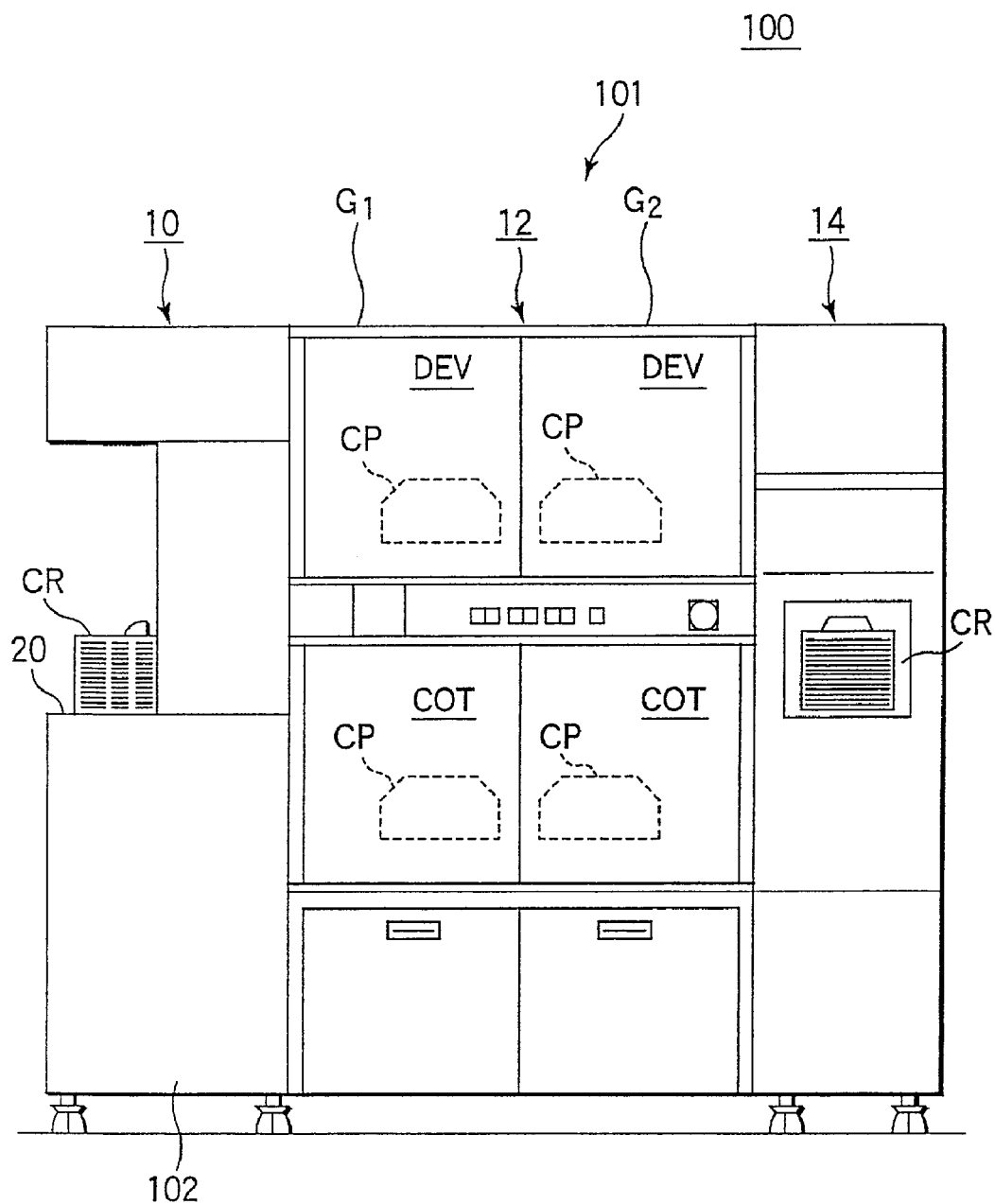
FIG. 3 is a front view of the photoresist coating and development apparatus shown in FIG. 1.

As shown in FIG. 3, there are stacked in the first process unit group $G_1$ the liquid process units such as a photoresist coating unit (COT) for spin-coating a photoresist film on the wafer surface, and a development unit (DEV) for developing a circuit pattern after light-exposure. Similarly, there are stacked the photoresist coating unit (COT) and the development unit (DEV) in the second process unit group $G_2$.

As shown in FIG. 4, in the third and fourth process units $G_3$ and $G_4$, there are stacked from the bottom to the top the eight units such as a thermal process unit such as a cooling unit (COL) for cooling the wafer W at a prescribed temperature, an adhesion unit (AD) for applying a hydrophobic process to the wafer before the resist coating, an alignment unit (ALIM) for adjusting the position of the wafer, an extension unit (EXT) for delivering the wafer between the stations, and a hot plate unit (HP) for heating the wafer W at a prescribed temperature. A portable pickup cassette CR is arranged in the front portion of the interface section 14, and a peripheral exposure apparatus 28 is arranged in the rear portion, while there is arranged in the central portion a wafer transfer mechanism 26 which has a wafer transfer arm 26a which is movable in the X and Z directions and accessible to the wafer cassette CR and the peripheral exposure apparatus 28. Further, the wafer transfer arm 26a is rotatable in θ direction and accessible to a not-shown wafer delivering platform in the peripheral exposure apparatus 28 and to the extension unit (Ext) in the process unit group $G_4$ in the processing station 12.

Figure 5:
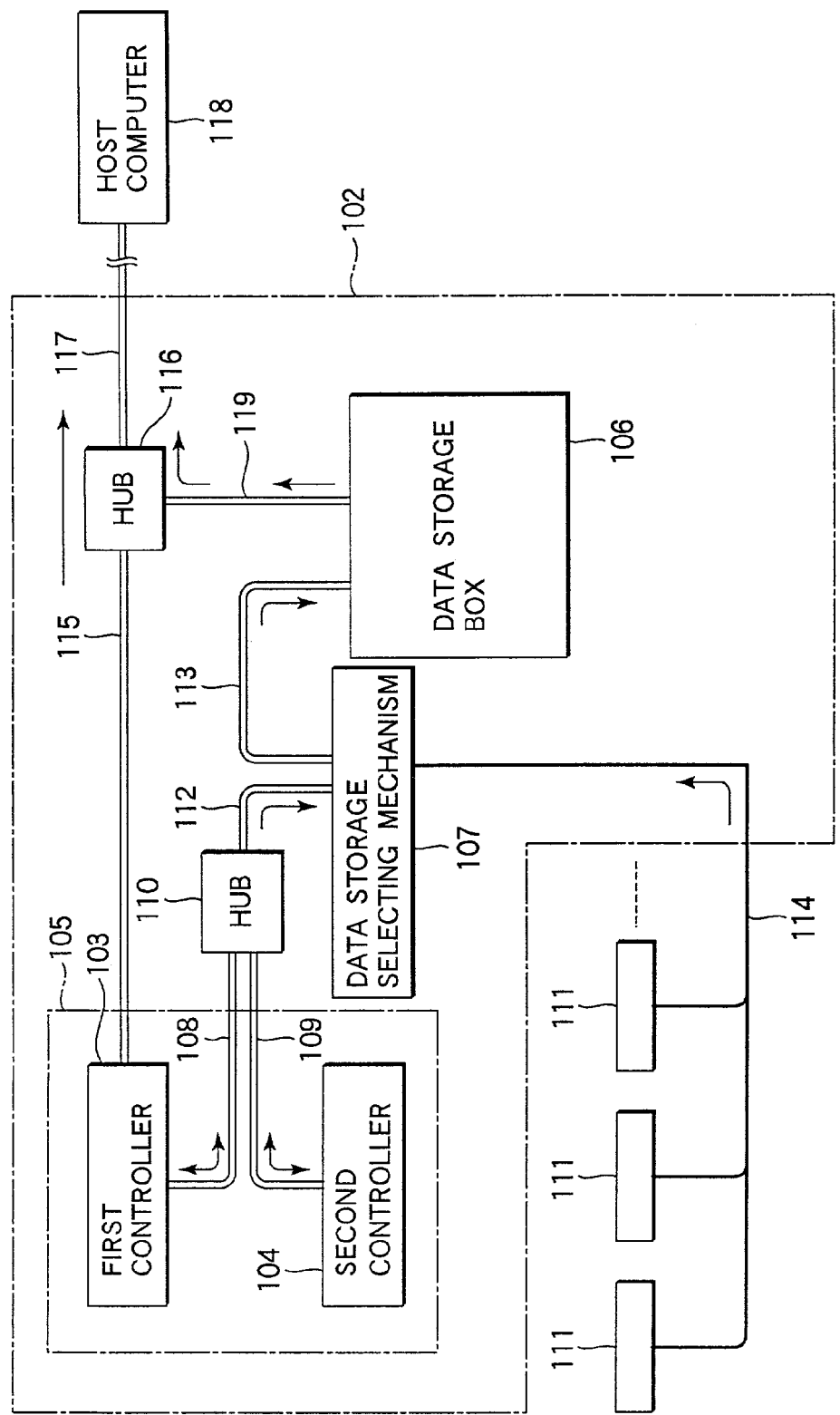
FIG. 5 is a block diagram of a control and data storage section in the photoresist coating and development apparatus shown in FIG. 1.

As shown in FIG. 5, the control and data storage section 102 comprises a control box 105 including a first controller 103 and a second controller 104, and a data storage box 106 for storing the data exchanged between the first controller 103 and the second controller 104. Further, the data storage section 102 includes a data storage selecting mechanism 107 for selecting the storage frequency of the data to the data storage box 106 in accordance with the kind of the data.

The first controller 103 controls the apparatus body 101 as a whole by controlling recipes, wafer transportation and display. Further, the first controller 103 is connected with a host computer 118 through a hub HUB 116, thereby communicating with the host computer 118 and instructing the second controller 104.

The second controller 104 is connected through a plurality of I/O boards with sensors and driving members, for outputting toward the first controller 103 measurement data such as temperature and humidity, alarm data and detection data, thereby controlling every process unit in the apparatus body 101, on the basis of the sensor information and instructions from the first controller 103.

A signal line 108 from the first controller 103 and a signal line 109 from the second controller 104 are connected with HUB 110 which is connected with the data storage box 106 through the data storage selecting mechanism 107. Therefore, at least a part of data transmitted between the first controller 103 and the second controller 104 can be stored, for example, every 2 seconds, into the data storage box 106 through HUB 112.

Further, a plurality of additional sensors 111 are provided in order to detect signals which are not transmitted between the first controller 103 and the second controller 104, for example, a drive signal for driving a drive member such as a valve, and to detect a part of measurement data such as temperature and humidity. These additional sensors 111 is connected through a signal line 114 with the data storage selecting mechanism 107. Therefore, the information from the additional sensor 111 can be stored into the data storage box 106 after selecting the storage frequency by the data storage selecting mechanism 107. The signals is supplied from the additional sensor 111, for example, in a time period shorter than 2 seconds.

The first controller 103 is connected through a signal line 115 with HUB 116 which is connected through a signal line 117 with the host computer 118 which receives the data from the first controller 103. Further, the data storage box 106 is connected through a signal line 119 with HUB 116 which transfers data from the data storage box 106 to the host computer 118. Therefore, the host computer 118 can analyze data from the first controller 103 and data storage box 106.

Figure 6:
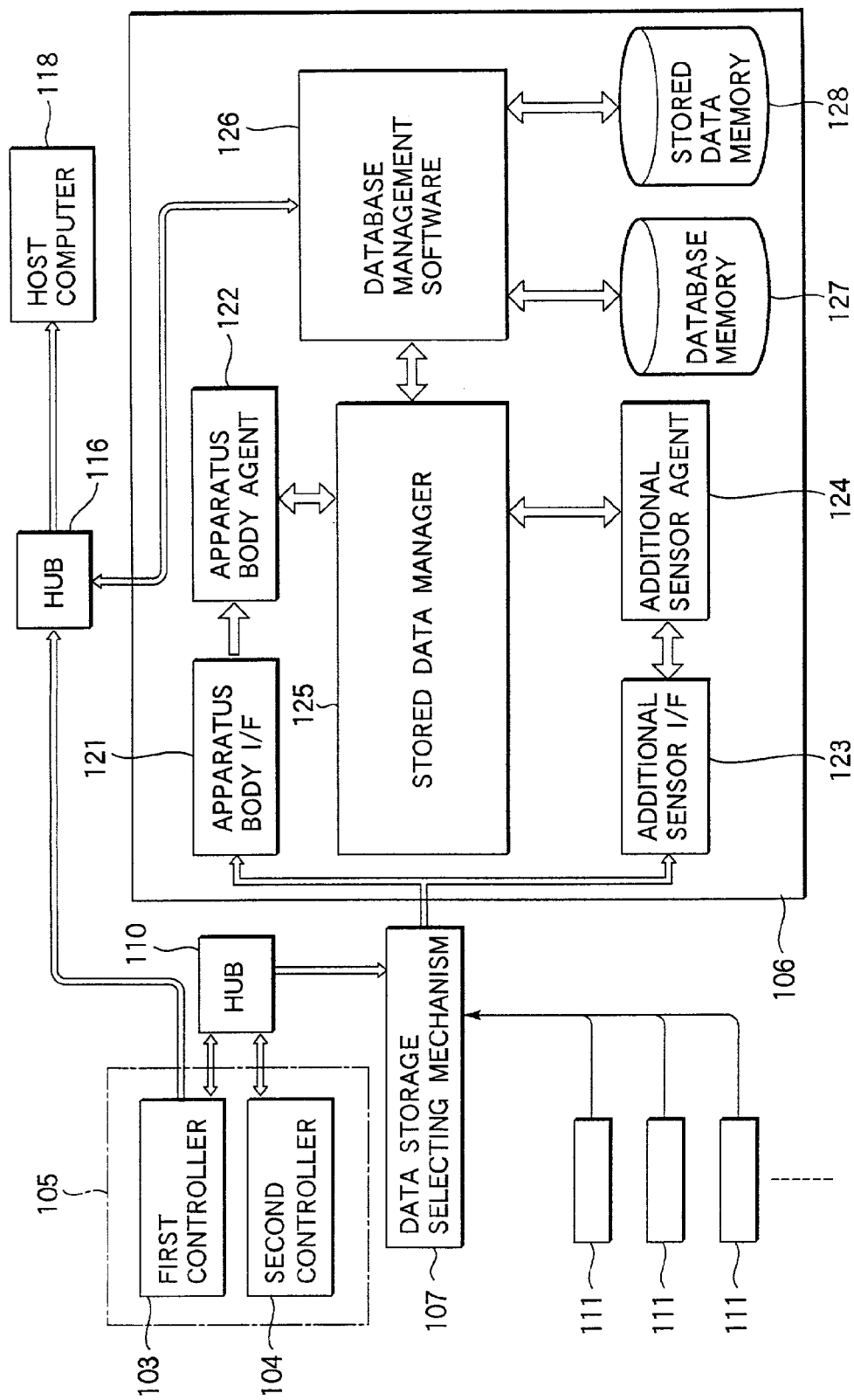
FIG. 6 is a block diagram of a data storage box of the control and data storage section shown in FIG. 5.

As shown in FIG. 6, the data storage box 106 comprises: an apparatus body interface 121 for receiving the signals transmitted between the first controller 103 and the second controller 104 through the data storage selecting mechanism 107; an apparatus body agent 122 for processing the signals received by the apparatus body interface 121; an additional sensor interface 123 for receiving the signals from the additional sensor 111 through the data storage selecting mechanism 107; an additional sensor agent 124 for processing the signal received by the additional sensor interface 123; a stored data manager 125 for receiving and transmitting data to and from the apparatus body agent 122 and the additional sensor agent 124 and further processing and storing these data; a database management software 126, a database memory 127 for storing database for storing data; and stored data memory 128 for storing data.

The frequency of storing the data in the data storage box 106 in accordance with the kind of the data is set in advance in the data storage selecting mechanism 107. The date storage selecting mechanism 107 discriminates the kind of the signal supplied through the HUB 110 and exchanged between the first controller 103 and the second controller 104 and the information supplied from the additional sensor 111 so as to output a signal to the data storage box 106 in accordance with the storage frequency of the data set in advance. For example, a predetermined data among a plurality of kinds of data is stored in the data storing box 106 for every wafer, and another predetermined data is stored in the data storage box 106 for every plural wafers, e.g., for every lot. The data that should be stored for every plural wafers include, for example, the measured data that are small in change such as temperature and humidity. Also, the data that should be stored for every wafer include, for example, the information on the processing operation in each process unit included in the apparatus body 101.

In the above-explained photoresist coating and development apparatus 100, the wafer W before processing is carried, by the wafer transfer mechanism 22, out one by one from the wafer cassette CR, and is carried into the alignment unit (ALIM). Then, the wafer W is aligned, carried out by the main wafer transfer mechanism 24, and carried into the adhesion unit (AD) in order to execute an adhesion process. After completing the adhesion process, the wafer W is carried out by the main wafer transfer mechanism 24, carried into the cooling unit (COL) in order to execute a cooling process. Next, the wafer W is transferred to the resist coating unit (COT) in order to coat a photoresist, further, pre-baked at the hot plate unit (HP). After completing the pre-baking, the wafer W is transferred, through an extension cooling unit (EXTCOL) and then through an interface section 14, to a light-exposure apparatus adjacent to the interface section 14. Then, the light-exposed wafer W is carried by the wafer transfer mechanism 26. Then, carried by the wafer transfer mechanism 26 into the process station 12 through the interface section 14 and the extension unit (EXT). In the processing station 12, the wafer W is transferred by the main wafer transfer mechanism 24 to the hot plate unit (HP) in order to execute a post-exposure process, further, transferred to the development unit (DEV) in order to execute a development process, further, carried to the hot plate unit (HP) in order to execute a post-bake process, further carried to the cooling unit (COL) in order to execute a cooling process, and carried to the cassette station 10 through the extension unit (EXT). Thus, the wafer transfer mechanism 22 carries into the wafer cassette CR the wafer W after the prescribed processes.

The series of operations described above are controlled by the control box 105 included in the control and data storage section 102. It should be noted that the signal exchanged between the first controller 103 and the second controller 104 within the control box 105 is supplied at least partly to the data storage selecting mechanism 107 through the HUB 110 at a time interval of, for example, 2 seconds and, then, further supplied to and stored in the data storage box 106 at a frequency set in advance in accordance with the kind of the data. In this case, the data supplied from the data storage selecting mechanism 107 into the data storage box 106 is transferred within the data storage box 106 through the apparatus body interface 121 so as to be processed in the apparatus body agent 122 and the stored data manager 125 and, then, stored in the stored data memory 128.

On the other hand, the information from the additional sensor 111 is supplied to the data storage selecting mechanism 107 at a cycle not longer than, for example, 2 seconds and, then, further supplied to and stored in the data storage box 106 at a frequency set in advance in accordance with the kind of the data. It should be noted that the data supplied from the data storage selecting mechanism 107 into the data storage box 106 is further transferred within the data storage box 106 through the additional sensor interface 123 so as to be processed in the additional sensor agent 124 and the stored data manager 125 and, then, similarly stored in the stored data memory 128.

The database stored in the database memory 127 and the data stored in the stored data memory 128 are processed by the database management software 126, and outputted to the host computer 118 through HUB 116.

Here, five typical data to be stored in the data storage box 106 are shown as follows, as an example.
  (1) measurement data such as temperature, humidity, or pressure
  (2) alarm data notifying trouble during processing
  (3) dispense data in liquid process unit such as coating process unit COT
  (4) drive system data such as cylinder
  (5) wafer transfer information and process information in process unit The measurement data (1) are controlled by the second controller 104, output from the second controller 104 toward the first controller 103 under normal conditions, and stored in the data storage box 106 through HUB 110. However, measurement data which is used under normal controls may be stored in the data storage box 106 not through the first and second controllers 103, 104.

The alarm data (2) is generated by each process unit, received by the second controller 104, and outputted from the second controller 104 toward the first controller 103, and stored in the data storage box 106 through HUB 110. The process histories are obtained in full detail, by storing the alarm data which indicate when, in which process unit, or during what kind of process, the alarm was generated.

Figure 7:
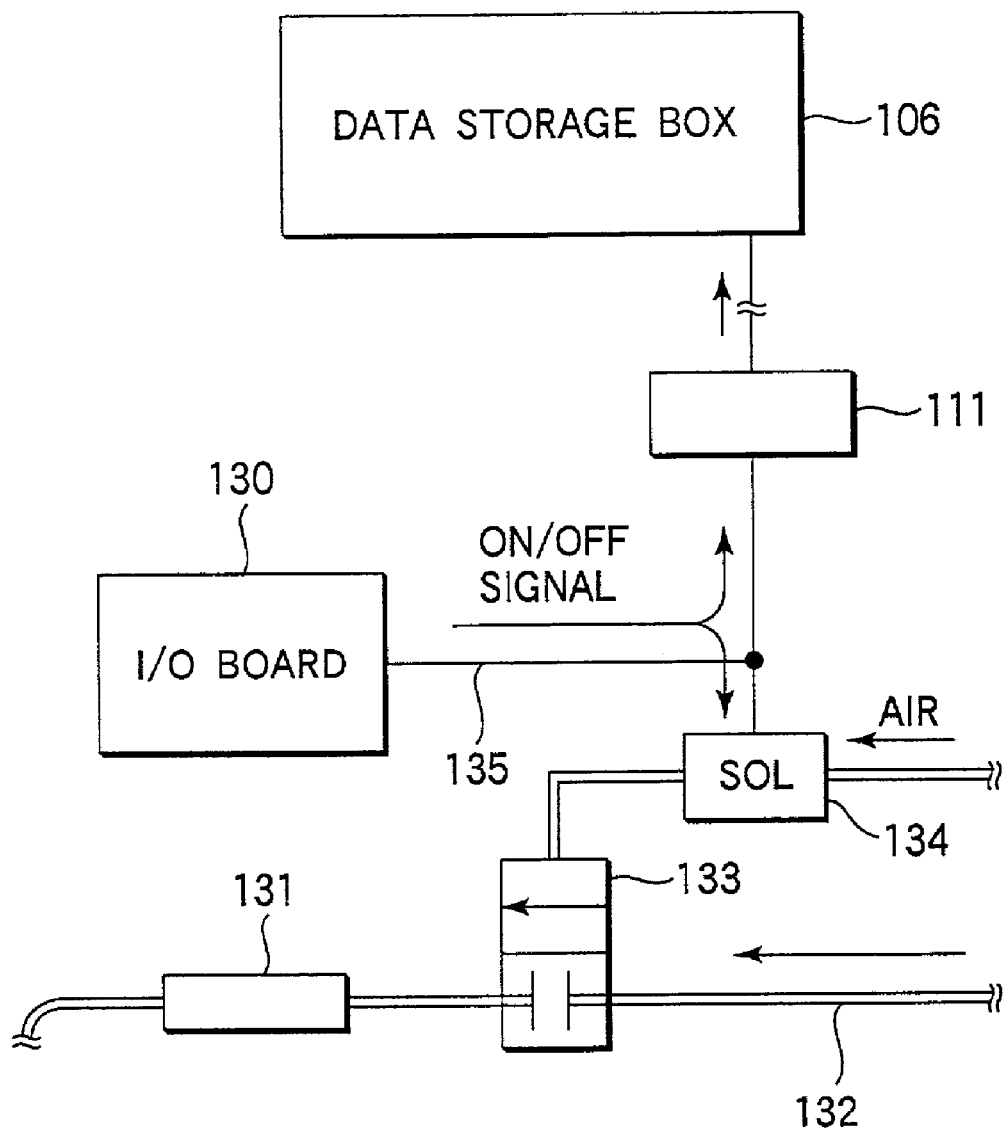
FIG. 7 is an illustration for explaining an example of data storage during supplying a process liquid in the photoresist coating and development apparatus shown in FIG. 1.

As shown in FIG. 7, regarding the dispense data (3), a ON/OFF signal for opening or closing air operation valve 133 is outputted from the second controller 104 through the I/O board 130 to a solenoid valve 134, when a spurting quantity of the process liquid from a nozzle 131 through a tube 132 is controlled by the air operation valve 133. In this case, the additional sensor 111 is connected with a control line 135, thereby detecting the ON/OFF signal for storing that data in the data storage box 106. As the ON/OFF signal is usually not transmitted and received between the first controller 103 and the second controller 104, the ON/OFF data directly outputted from the additional sensor 111 is stored in the data storage box 106 not through the first controller 103 and the second controller 104. However such data as the above-explained ON/OFF signals may be transmitted and received between the first controller 103 and the second controller 104. In this case, that data can be stored in the data storage box 106 through HUB 110. By storing these data, all the information about when the air operation valve 133 was opened and closed. Further, for example, these data are related to the dispense data, thereby obtaining a process history.

Figure 8:
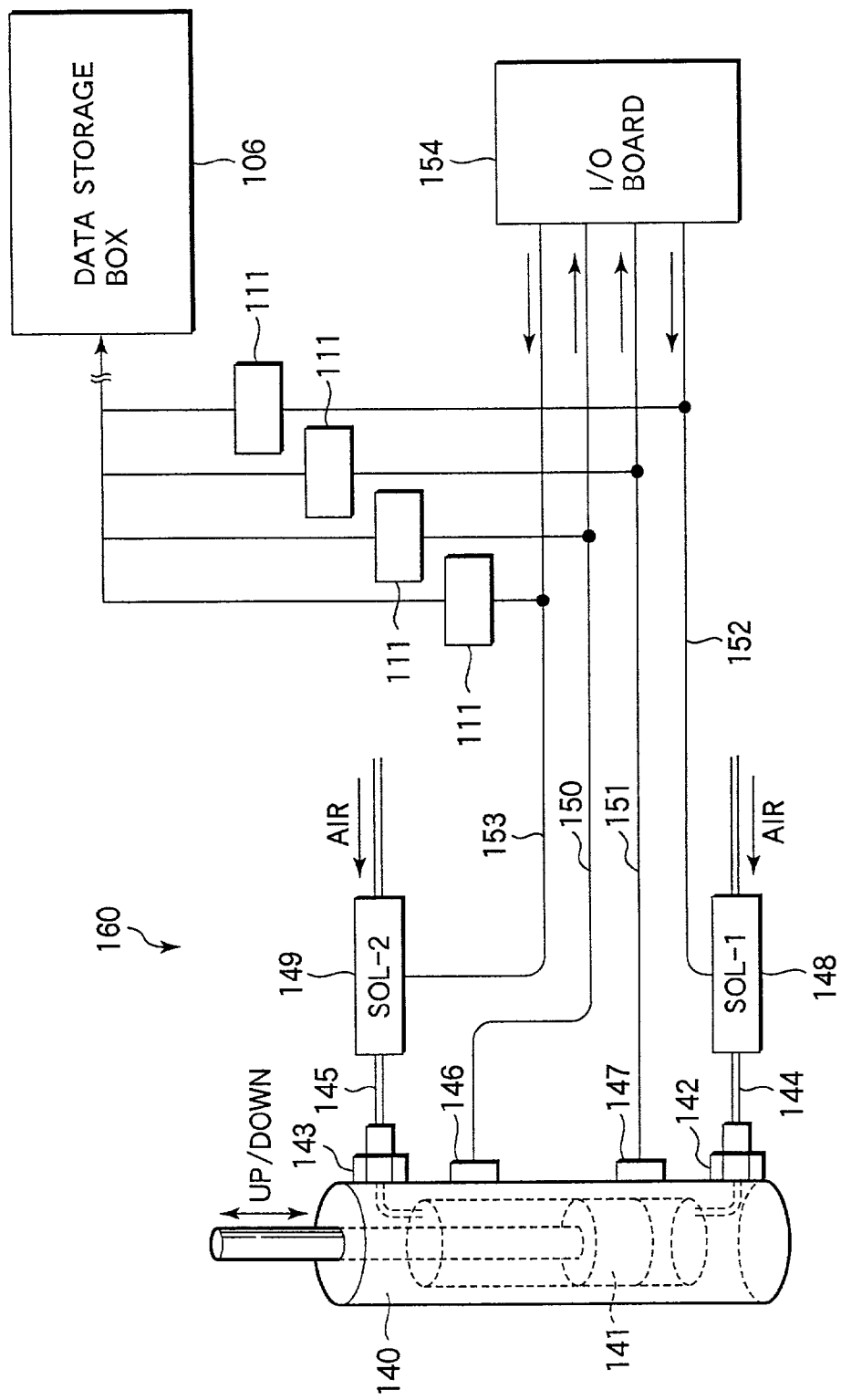
FIG. 8 is an illustration for explaining examples of an air cylinder, control of operation of the air cylinder, and data storage in the photoresist coating and development apparatus shown in FIG. 1.

As shown in FIG. 8, the drive system data (4) is used for controlling a typical drive system such as an air cylinder for ascending and descending the wafer W and other thing. An air cylinder 160 comprises a cylinder body 140, and a piston 141 which moves forward or backward, or ascends or descends, in the cylinder body 140. A lower air inlet 142 connected with lower air tube 144 is provided at a lower portion of the cylinder body 140, while an upper air inlet 143 connected with upper air tube 145 is provided at an upper portion of the cylinder body 140, thereby ascending the piston 141 by introducing an air through the lower air tube 144 to the lower air inlet 142 and descending the piston 141 by introducing an air through the upper air tube 145 to the upper air inlet 143. Further, a first solenoid valve (SOL-1) 148 is provided with the lower air tube 144, while a second solenoid valve (SOL-2) 149 is provided with the upper air tube 145, thereby ascending or descending the piston 141 by switching on and off these solenoids. Furthermore, a first position sensor 146 is provided at an upper portion of the cylinder body 140, while a second position sensor 147 is provided at a lower portion of the cylinder body 140, thereby detecting an upper or lower limit position of the piston 141.

Further, the first position sensor 146, the second position sensor 147, the first solenoid valve 148, and the second solenoid valve 149 are connected with signal lines 150, 151, 152 and 153, respectively. Further, these signal lines are connected with I/O board 154 which is connected with the second controller 104 which transmits control signals through the I/O board 154 and signal lines 150, 151, 152 and 153 toward the first position sensor 146, the second position sensor 147, the first solenoid valve 148, and the second solenoid valve 149. Concretely, when a piston 141 starts moving, a control signal is output to either the first solenoid valve 148 or the second solenoid valve 149. Further, when a piston 141 is stopped, a detection signal from either the first position sensor 146 or the second position sensor 147 is outputted through the I/O board 154 to the second controller 104. Thus, the piston 141 is stopped, on the basis of the detection signal.

In this case, the additional sensors 111 are connected with the signal line 150 of the first position sensor 146, the signal line 151 of the second position sensor 147, the signal line 152 of the first solenoid valve 148 and the signal line 153 of the second solenoid valve 143. Thus, the additional sensors 111 can receive detection signals from these position sensors and ON/OFF signals from these solenoid valves, thereby storing these detection signals and ON/OFF signals in the data storage box 106.

Figure 9:
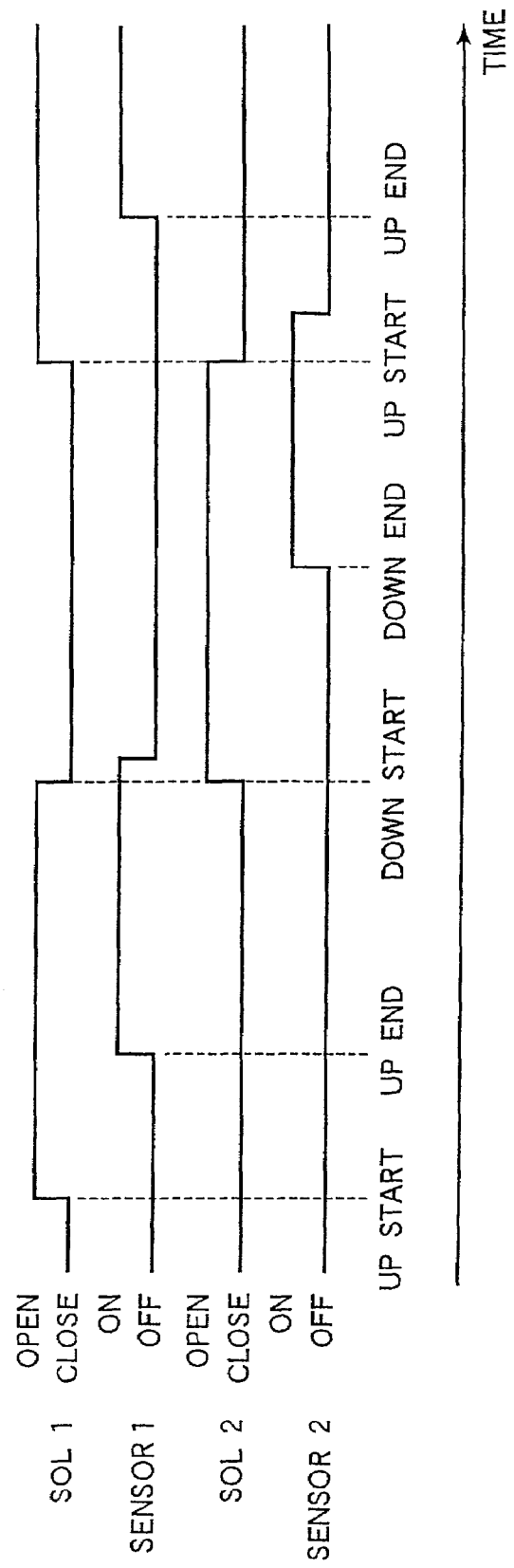
FIG. 9 is a timing chart for explaining data stored during controlling the air cylinder shown in FIG. 5.

As shown in FIG. 9, actual stored data are time series data of ON/OFF timings of the first position sensor (SENSOR 1) 146 and the second position sensor (SENSOR 2) 147, and ON/OFF timings of the first solenoid valve (SOL 1) 148 and the second solenoid valve (SOL 2) 149. Concretely, when the first solenoid valve (SOL 1) 148 is opened, the piston 141 starts ascending (UP START). Further, when the first position sensor (SENSOR 1) 146 is switched ON, the piston 141 stops ascending (UP END). Next, when the first solenoid valve (SOL 1) 148 is closed and the second solenoid valve (SOL 2) 149 is opened, the piston 141 starts descending (DOWN START). Further, when the second position sensor (SENSOR 2) 147 is switched ON, the piston 141 stops descending (DOWN END). These steps are repeated by opening or switching on the first solenoid valve (SOL 1) 148 in order to start ascending (UP START) the piston 141.

According to the above-explained data storage, it makes possible to grasp the operation history of the cylinder mechanism 160 on a time series basis and, thus, to store the information on the operation of the cylinder mechanism 160 in the state of being utilized effectively. Therefore, it is possible to grasp a variation in the operation timing among the cylinder mechanisms 160, which has not been grasp until now. For example, where there is a variation in the operations of the cylinder mechanisms 160 of the modules in the multi-module system, it is possible to grasp easily the deviation in the operation of each cylinder mechanism from the information stored in the data storage box 106 to supervise effectively the adjustment or the like of the cylinder mechanism 160. In the concrete, the air cylinder 160 may be used in the case such as an operation of ascending and descending pins, wherein the wafer W is received by ascending and descending pins over the hot plate in hot plate unit (HP), placed on the hot plate by descending the piston 141, held up after a prescribed time period by ascending the ascending and descending pins, and carried out by the pincettes 93 from the hot plate unit (HP). By storing the information on the operation of ascending and descending pins on a time series basis in the storage box 160 and combining the wafer transfer log, it is possible to grasp a variation in the processes of the hot plate units (HP) to execute the fine adjustment or the like of the timing of operation of the ascending and descending pins.

As the data of the air cylinder mechanism 160 is not transmitted and received between the first controller 103 and the second controller 104 under normal conditions, this data output from the additional sensors 111 and stored in data storage box 106 not through the first and second controllers 103, 104. However, such data may be transmitted and received between the first controller 103 and the second controller 104. In the case, the data is stored in the data storage box 106 through HUB 110.

The wafer transfer information and process information in process unit (5) are stored in the data storage box 106 through HUB 110, because wafer transfer information in the first controller 103, and information about carrying the wafer W in and out each process unit and process information in each process unit in the second controller 104 are transmitted and received between the first controller 103 and the second controller 104. The wafer transfer information actually stored include such information about the carrying the wafer W in and out each process unit, while the process information actually stored include such information about the beginning and completion of processing in each process unit.

Incidentally, it is possible for the data storage to be performed for every wafer, for every lot, or for every processing. Also, the data is stored in the data storage box 106 on a time series basis so as to make it possible to grasp the history of the processing from the data stored in the data storage box 106. Concerning the timing of the data storage, it is possible to start the data storage at the time when the wafer W is transferred into the process unit or at the time when the processing is started in the process unit.

In this manner, as the data transmitted and received between the first controller 103 and the second controller 104 are received by and stored in the data storage box 106, through HUB 110 and at a prescribed timing, various data during processes are collected automatically, thereby easily obtaining data necessary for grasping the process history. Concretely, the data transmitted and received between the first controller 103 and the second controller 104 include detection data for processing, alarm data, process data, wafer transfer data, and other data necessary for grasping process history. Therefore, it becomes easy to grasp the process history by reading out the data stored in the data storage box 106.

Further, as the signals which are not transmitted and received between the first controller 103 and the second controller 104 are detected by the additional sensors 111, stored data are diversified and process history is grasped more precisely.

Among these stored data, the data such as the temperature and the humidity, which are a kind of the measured data, are required all through the processing. However, since these data are basically small in change, it suffices that the frequency of the data storage to be low. On the other hand, it is necessary to store the data in every wafer in respect of (2) the alarm data, (3) the dispense data of the process liquid, (4) the drive system data, and (5) the wafer transfer information in process unit noted above. Therefore, in this embodiment, the storage frequency is selected by the data storage selecting mechanism 107 in accordance with the kind of the data. A specific example of the data storage in respect of, for example, the measured data that is small in change is that the data is stored once for a plurality of wafers. For example, the data is stored at least once for a single lot, e.g., a single cassette, such that the data is stored for only the first wafer in a single lot, for only the first and last wafers in a single lot, or for only the first, intermediate and last wafers in a single lot.

Figure 10:
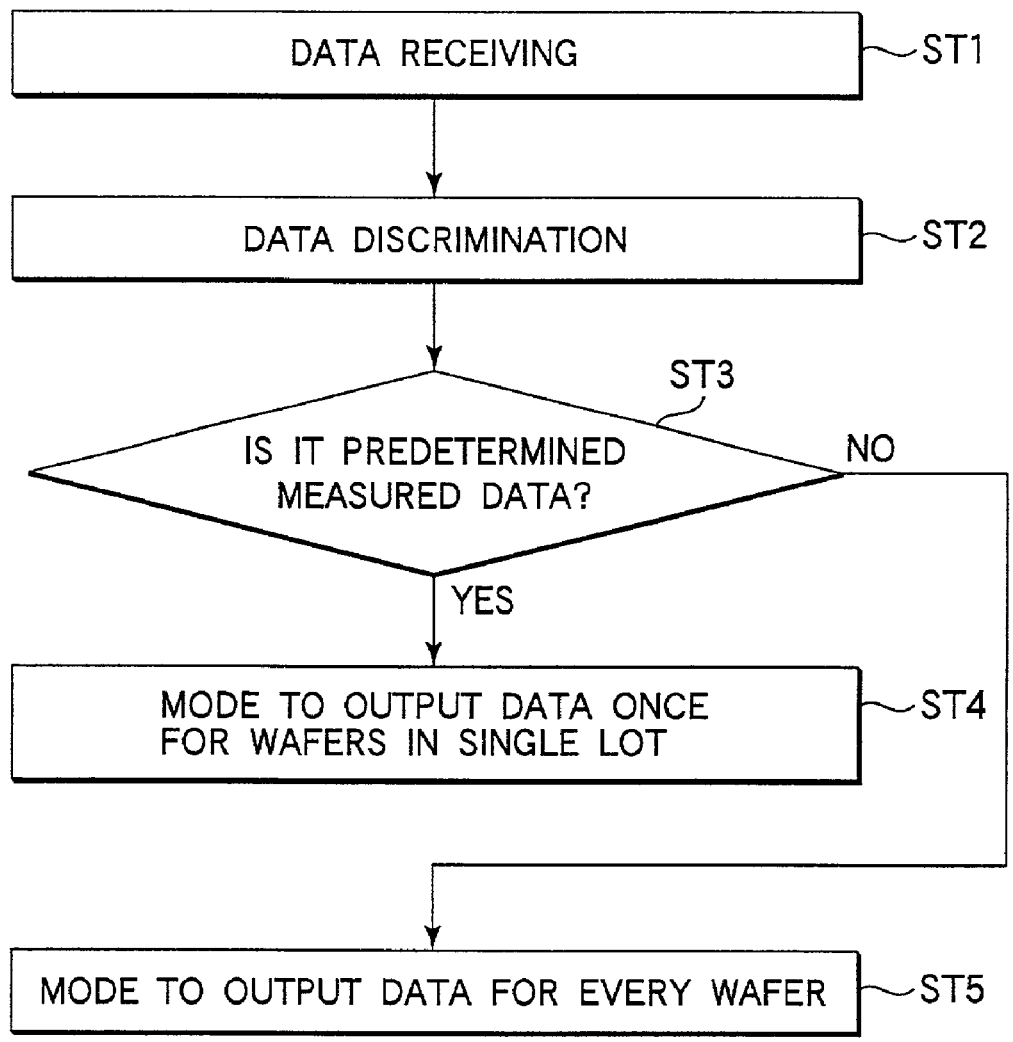
FIG. 10 is a flow chart for explaining a process flow in a data storage selecting mechanism of the control and data storage section.

An example of the data storage selecting flow in the data storage selecting mechanism 107 will now be described with reference to FIG. 10.

In the first step, the data supplied through the HUB 110 and exchanged between the first controller 103 and the second controller 104 and the data supplied from the additional sensor 111 are received at a predetermined interval (ST1), followed by discriminating the received data (ST2). Then, it is judged whether or not the received data are the predetermined measured data such as the temperature and the humidity (ST3). Where the received data are the predetermined measured data, a mode is set such that the data is supplied to the data storage box 106 once for all the wafers in a single lot, and the data is stored at the corresponding timing alone (ST4). On the other hand, where the received data differ from the predetermined measured data, another mode is set such that data is supplied to the data storage box 106 for all the wafers, and all the data supplied to the data storage selecting mechanism 107 is supplied to the data storage box 106 (ST5).

It is possible to decrease the storing amount of the data such as the data small in change by allowing the data storage selecting mechanism 107 to select the storage frequency of the data in accordance with the kind of the data as described above so as to markedly decrease the information stored in the data storage box 106. It is necessary for the photoresist coating and development apparatus 100 to store a tremendous amount of data. However, it is possible to markedly decrease the amount of data that is to be stored, making it possible to carry out the data storage more effectively.

Figure 11:
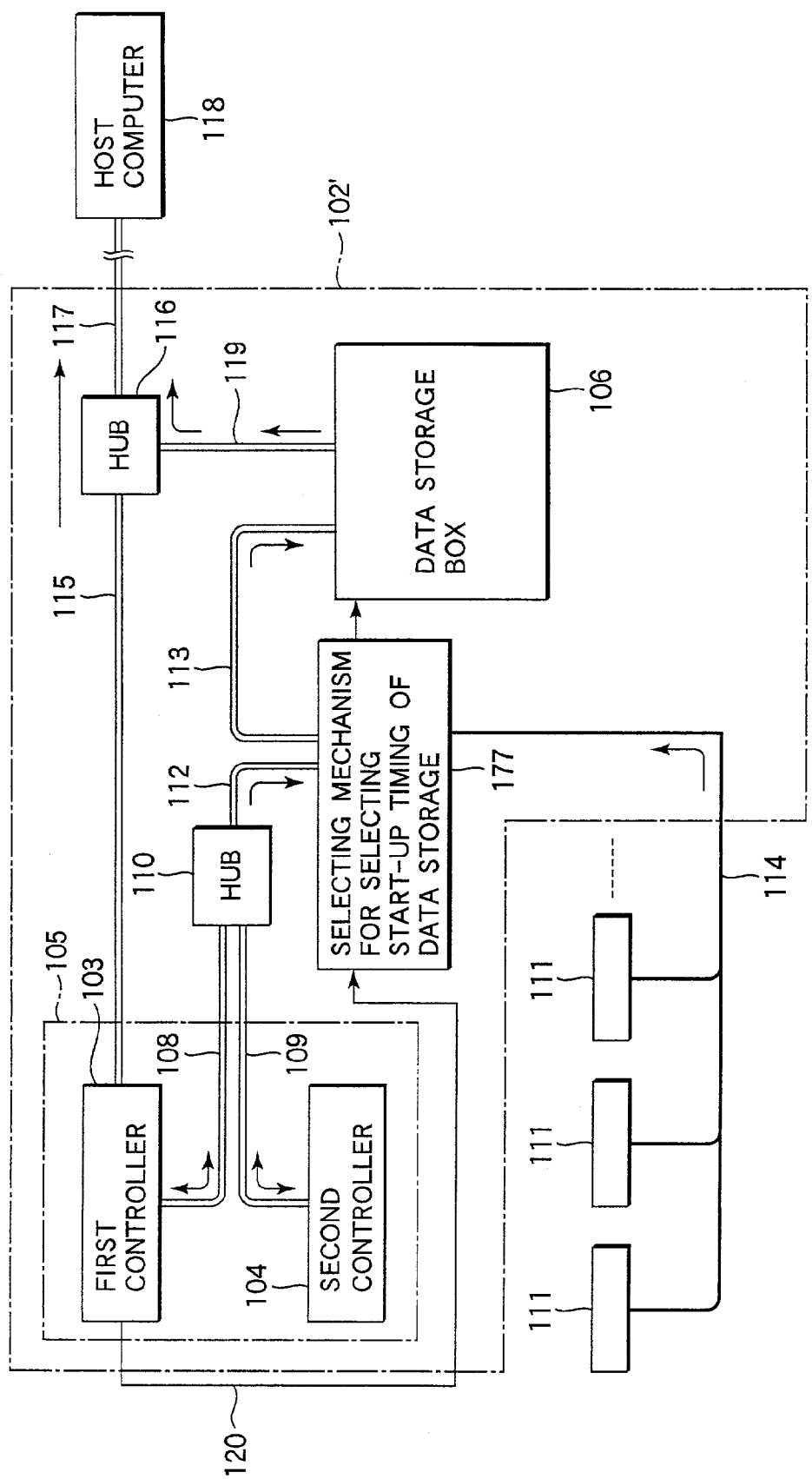
FIG. 11 is a block diagram showing another example of the control and data storage section.
Figure 12:
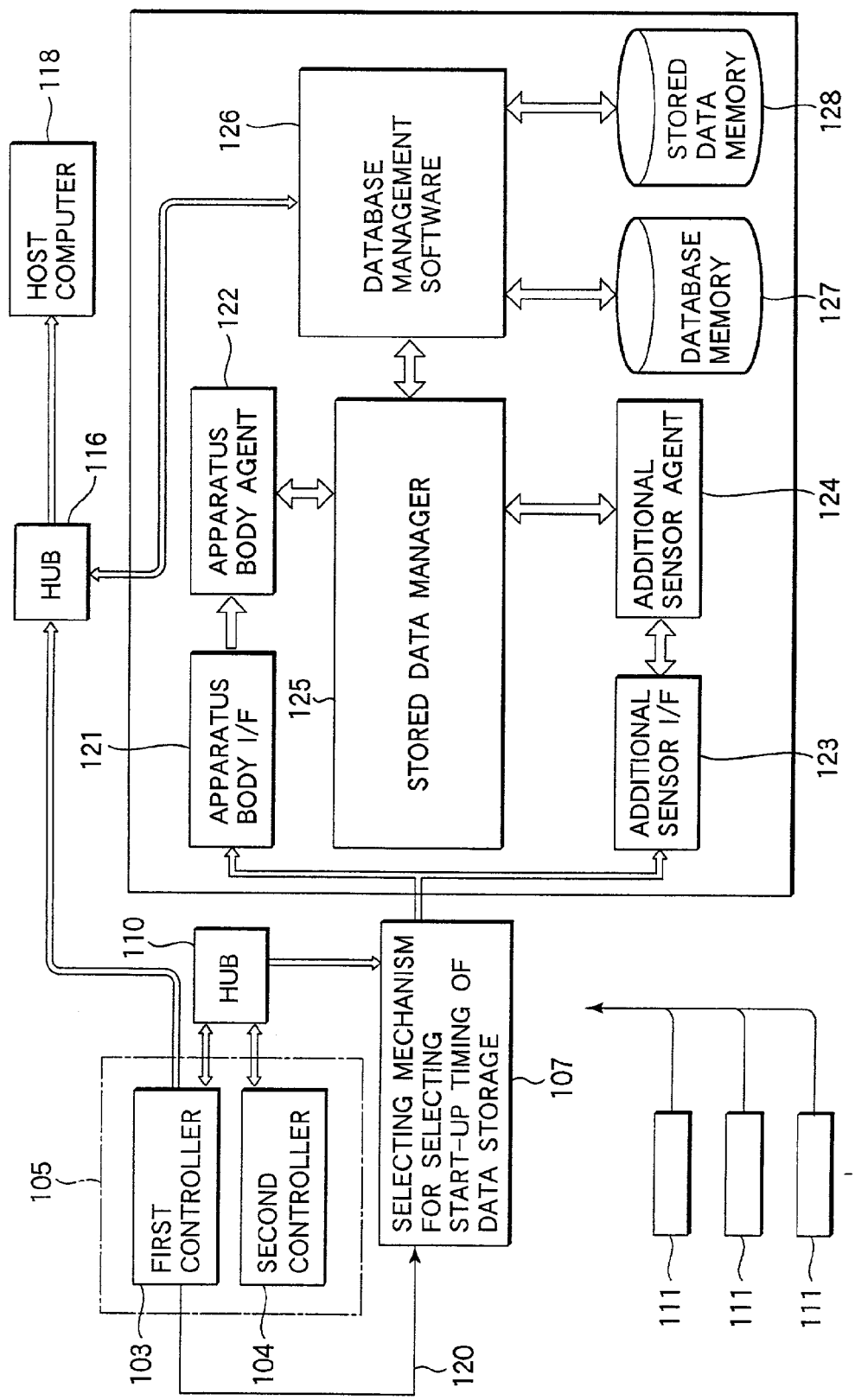
FIG. 12 is a block diagram of a data storage box in the control and data storage section shown in FIG. 11.

Another embodiment of the control and data storage section will now be described. FIG. 11 is a block diagram showing another example of the control and data storage section. On the other hand, FIG. 12 is a block diagram showing the construction of the data storage box included in the control and data storage section shown in FIG. 11. Incidentally, the basic construction of the control and data storage section 102' shown in FIG. 11 and the construction of the data storage box are substantially equal to those shown in FIGS. 5 and 6 and, thus, the reference numerals equal to those shown in FIGS. 5 and 6 are put to the members equal to those shown in FIGS. 5 and 6 so as to simplify the description. In the embodiment shown in FIGS. 11 and 12, a selecting mechanism 177 for selecting the start-up timing of the data storage in the data storage box 106 in accordance with the kind of data is used in place of the data storage selecting mechanism 107 shown in FIG. 5.

An additional sensor 111 is connected to the selecting mechanism 177 for selecting the start-up timing of the data storage through a signal line 114. Therefore, it is possible to output the information from the additional sensor 111 into the data storage box 106 for the storage after the start-up timing of the storage is selected by the selecting mechanism 177.

The selecting mechanism 177 is connected to a first controller 103 through signal line 120 so as to permit the transfer information of the wafer W to be supplied from the first controller 103 to the selecting mechanism 117. On the other hand, information on the timing of starting the data storage in the data storage box 106 in accordance with the kind of data is set in advance in the selecting mechanism 177. The kind of signal supplied through the HUB 110 and exchanged between the first controller 103 and the second controller 104 and the information supplied through the additional sensor 111 are discriminated, and the start-up timing of the data storage is selected in accordance with the discriminated data. Then, the data storage in the data storage box 106 is started at a predetermined timing on the basis of the timing information noted above and the wafer transfer information supplied from the first controller 103. For example, in respect of a predetermined data among the plural kinds of data, the data storage in the data storage box 106 is started from before the wafer W is transferred into the process chamber of the target process unit and, concerning another predetermined data, the data storage in the data storage box 106 is started after the wafer W is transferred into the process chamber of the target process unit. The data whose storage in the data storage box 106 is started from before the wafer W is transferred into the process chamber includes the data that affects the wafer processing even before the wafer transfer into the process unit. On the other hand, the data whose storage in the data storage box 106 is started after the wafer W is transferred into the process chamber includes the data that does not affect the wafer processing before the wafer is transferred into the process chamber. Also, it is possible to start the data storage in the data storage box 106 after start up of the processing applied to the wafer, i.e., after start up of the recipe, depending on the data. It is also possible to continue the data storage regardless of the wafer transfer into the process unit depending on the data. In this case, the selecting mechanism 177 is set at a mode that the data is always stored.

Among the stored data noted above, the measured data such as the temperature and the humidity is required all through the processing and, thus, it is desirable to continue to store the measured data at a predetermined cycle, though it is possible to lower the storing frequency if it is known that the change is small. Concerning the other data, it is possible to store the data for every wafer, for every lot, or for every processing. In this case, it is possible to continue to store the data all through the data storing unit period or to store the data at least once during the data storing unit period such that the data is stored at the starting time and/or the finishing time of the data storing unit period.

For example, the data storage in the data storage box 106 is started from before the wafer W is transferred into the process chamber of a target process unit in respect of the data that affects the wafer processing even before the wafer is transferred into the process chamber such as the hot plate temperature of the hot plate unit (HP), the plate temperature of the cooling plate (COL), the temperature and humidity of the photoresist coating unit (COT) and development unit (DEV), the temperatures of the various process liquids, and the flow rate of the down-flow stream of the clean air. Also, it is possible to start the data storage in the data storage box 106 after the wafer W is transferred into the process chamber of a target process unit in respect of the data that does not affect the wafer processing before the wafer is transferred into the process chamber such as the various inspections and measurements including, for example, the measurement of the resist film thickness and the measurement of the developed line width, and the light exposure. Further, it suffices to start the data storage in the data storage box 106 after the wafer processing is started, i.e., after the recipe is started, in respect of the data such as the discharge amounts and the discharge rates of various process liquids, the moving distance and the moving speed of each nozzle arm, the time for the upward and downward movement of the pin for vertically moving the wafer, and the time for the upward and downward movement of the wafer chuck. Further, some of the measured data are continuously stored as described above. It follows that the storing timing of the data is selected by the selecting mechanism 177 in accordance with the kind of the data in the control and data storage section 102' in this embodiment. In the selecting mechanism 177, the storing timing of the inputted data is selected on the basis of the information on the start-up timing of the data storage set in advance in accordance with the kind of the data and the information on the wafer transfer supplied from the first controller 103.

Figure 13:
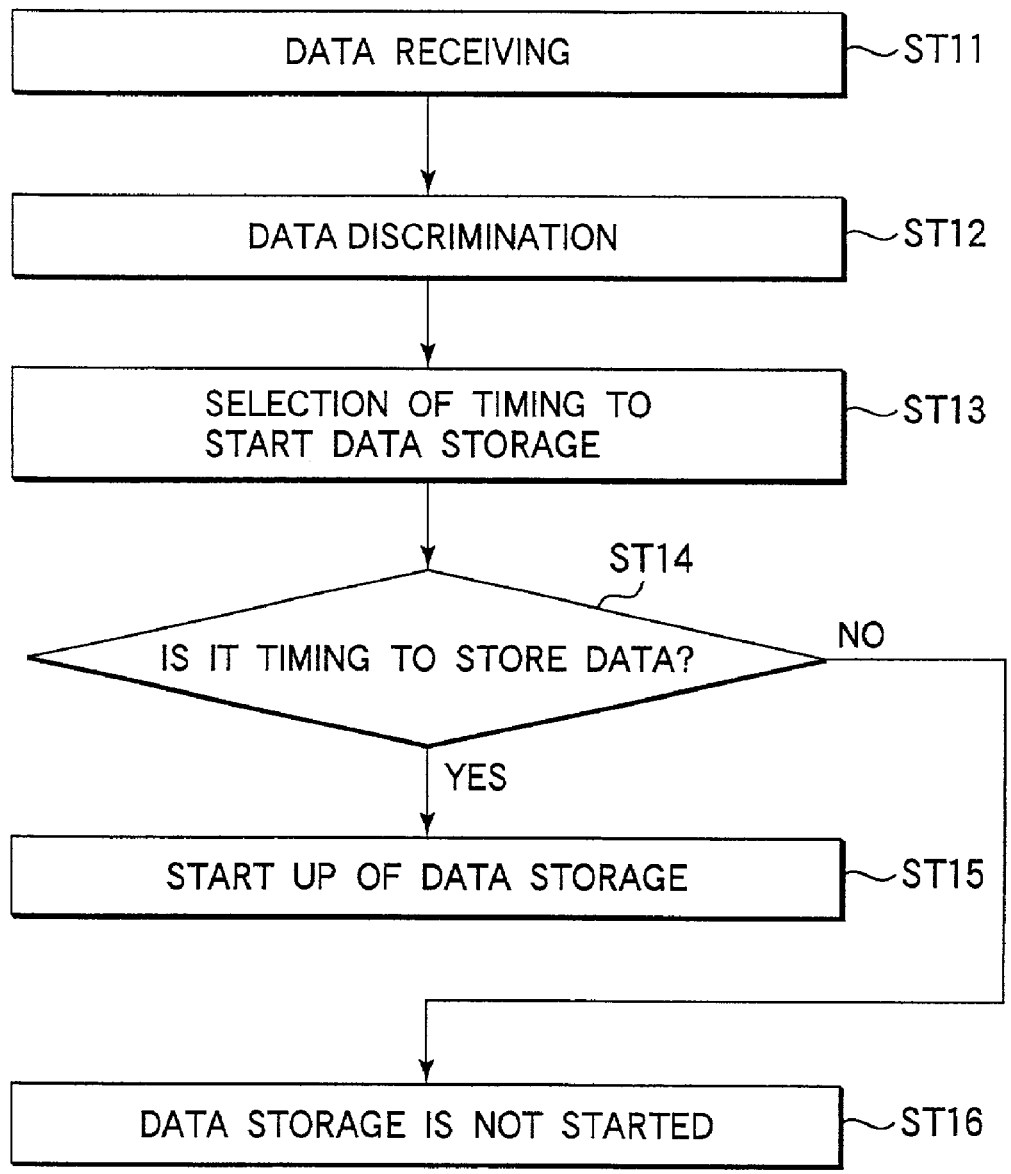
FIG. 13 is a flow chart for explaining a process flow in a selecting mechanism for selecting the start-up timing of the data storage in the control and data storage section shown in FIG. 11.

An example of the flow chart for selecting the start-up timing of the data storage in the selecting mechanism 177 will now be described with reference to FIG. 13.

In the first step, the data supplied through the HUB 110 and exchanged between the first controller 103 and the second controller 104 and the data supplied from the additional sensor 111 are received at a predetermined interval (ST11), followed by discriminating the received data (ST12). Then, the start-up timing of the data storage is selected on the basis of the information set in advance in respect of the received data (ST13). Further, it is judged on the basis of the information on the start-up timing of the data storage and on the wafer transfer information supplied from the first controller 103 whether or not the timing to start the data storage in the data storage box 106 has come (ST14). If it is judged that the timing to start the data storage has come, the data storage in the data storage box 106 is started (ST15). If it is judged that the timing to start the data storage has not come, the data storage in the data storage box 106 is not started (ST16).

As described above, since the timing to start the data storage is selected by the selecting mechanism 177 in accordance with the kind of the data, it is possible to prevent the storage of an extra data so as to make it possible to markedly decrease the information stored in the data storage box 106. For example, in this embodiment of the present invention, the data storage is started from before the wafer W is transferred into the process chamber of the process unit when it comes to the information that is required to be obtained from before the wafer W is transferred into the process chamber. However, the data storage is started after the wafer is transferred into the process chamber when it comes to the information that need not be obtained before the wafer is transferred into the process chamber. Further, the data storage is started after the start up of the processing in the case where it suffices to start the data storage after the start up of the processing applied to the wafer W. It follows that it is possible to markedly decrease the amount of the stored data, compared with the case where the data is stored from before all the wafers are transferred into the process chamber. Although the photoresist coating and development apparatus 100 is required to store a tremendous amount of data, the data storage can be performed more effectively because the amount of the stored data can be markedly decreased as described above.

Further, the present invention can be modified within the technical idea of the present invention, without limiting it to the disclosed embodiment. For example, although the data transmitted and received between the first controller 103 and the second controller 104 are taken into and stored in the data storage box 106 in the above-explained embodiment, the data which are taken in and stored may be the data from the first controller 103, the data from the second controller 104, or 2 or more data among the data from the first controller, the data from the second controller 104, and the data transmitted and received between the first controller 103 and the second controller 104. Further, signals from control mechanism may be directly stored, without using any controller. Furthermore, although the data from the additional sensors 111 are stored in the data storage box 106 not through the first and second controllers 103, 104 in the disclosed embodiment, the additional sensors are not necessarily required, if all the information are transmitted and received between the first controller 103 and the second controller 104.

The embodiment described above covers the case where the data on the wafers in a single lot is stored in respect of the measured data such as the temperature and the humidity, and the data on all the wafers is stored in respect of the other data by using the data storage selecting mechanism 107. However, the present invention is not limited to the particular case. For example, it is possible to store the data at a predetermined timing all through the wafer processing operation in respect of a predetermined data and to store the data only when the wafer is transferred into or out of the process chamber in respect of the other data.

Further, the embodiment described above covers the case where the timing to start the data storage is determined by the selecting mechanism 177 for selecting the start-up timing of the data storage such that the data storage is started either before or after the wafer is transferred into the process chamber, or after the processing applied to the wafer is started. However, the present invention is not limited to the particular case.

Further, although a photoresist coating and development apparatus are explained as an example, the present invention can be applied to all the processing apparatus for processing a substrate such as a semiconductor wafer.

The embodiments described above are simply intended to clarify the technical concept of the present invention. Of course, the present invention should not be limited to the embodiments described above in interpreting the technical scope of the present invention. The present invention can be worked in variously modified fashions within the spirit of the present invention and within the scope defined by the accompanying claims.

What is claimed is:

1. A substrate processing apparatus comprising:
    a processing apparatus body configured to perform a process on a target substrate;
    a control mechanism configured to control the processing apparatus body; and
    an information storage section configured to store a process history in the processing apparatus body,
    wherein the processing apparatus body comprises
    a plurality of process units each configured to perform a predetermined process on the target substrate,
    a transfer mechanism configured to transfer the target substrate between the plurality of process units,
    a cylinder mechanism disposed on at least one of the plurality of process units and configured to execute a predetermined driving, and
    detecting means for detecting a signal corresponding to a predetermined operation of the cylinder mechanism,
    wherein the control mechanism comprises
    a first control section configured to control the processing apparatus body as a whole, and
    a second control section configured to respectively control the plurality of process units in accordance with instruction signals output from the first control section, and configured to output a signal containing information necessary for grasping process histories of the plurality of process units, and
    wherein the information storage section is configured to take in a signal transmitted between the first control section and the second control section so as to store information contained in the signal thus taken in, which is used for grasping process histories of the plurality of process units, and is configured to store, as time information, detection information concerning an operation of the cylinder mechanism detected by the detecting means.

2. The substrate processing apparatus according to claim 1, wherein the cylinder mechanism comprises a cylinder body, a piston disposed to be reciprocable in the cylinder body, a first medium line for supplying the cylinder body with medium to move the piston outward, a second medium line for supplying the cylinder body with medium to move the piston inward, a first valve for opening and closing the first medium line, a second valve for opening and closing the second medium line, a first sensor for detecting an outward movement limit of the piston, a second sensor for detecting an inward movement limit of the piston, and a control mechanism configured to control operation of the cylinder mechanism, and wherein the detecting means detects opening and closing of the first and second valves and on and off states of the first and second sensors.

3. The substrate processing apparatus according to claim 2, wherein the detecting means comprises a plurality of detecting sections disposed to correspond to the first and second valves and the first and second sensors.

4. The substrate processing apparatus according to claim 1, wherein the processing apparatus body is configured to perform resist coating on the target substrate, and development, after exposure, on a resist film formed by the resist coating.

* * * * *